US 7,733,728 B2
Jun. 8, 2010

(12) United States Patent
Sudo

(10) Patent No.: US 7,733,728 B2
(45) Date of Patent: Jun. 8, 2010

(54) NON-VOLATILE SEMICONDUCTOR MEMORY DEVICE

(75) Inventor: Naoaki Sudo, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/442,296

(22) Filed: May 30, 2006

(65) Prior Publication Data
US 2006/0267076 A1 Nov. 30, 2006

(30) Foreign Application Priority Data
May 31, 2005 (JP) ............................. 2005-160346

(51) Int. Cl.
*G11C 7/02* (2006.01)
(52) U.S. Cl. ............................. 365/210.1; 365/185.01
(58) Field of Classification Search ................ 365/210, 365/210.1, 185.01
See application file for complete search history.

(56) References Cited

U.S. PATENT DOCUMENTS

| 3,604,988 | A | * | 9/1971 | Kahng et al. ................. 257/324 |
| 4,366,559 | A | * | 12/1982 | Misaizu et al. .............. 365/205 |
| 5,105,385 | A | * | 4/1992 | Ohtsuka et al. ............ 365/185.2 |
| 6,385,097 | B1 | * | 5/2002 | Liao et al. ................ 365/189.07 |
| 2001/0006479 | A1 | * | 7/2001 | Ikehashi et al. ........ 365/185.24 |
| 2002/0172068 | A1 | * | 11/2002 | Hidaka ....................... 365/100 |
| 2003/0232284 | A1 | * | 12/2003 | Liu et al. ..................... 430/314 |
| 2004/0008543 | A1 | * | 1/2004 | Kato ...................... 365/189.01 |

FOREIGN PATENT DOCUMENTS

JP 2002-8386 1/2002

* cited by examiner

*Primary Examiner*—Hoai V Ho
*Assistant Examiner*—Jason Lappas
(74) *Attorney, Agent, or Firm*—McGinn IP Law Group, PLLC

(57) ABSTRACT

Disclosed is to enable high speed reading from a storage node when a read is executed. A main cell array is constituted from main cell division units 20a. Each main cell division unit 20a includes select gates SG that extend in a vertical direction, common sources CS that extend in a horizontal direction below the select gates SG outside a cell region, word lines W0 to W15 that extend above the select gates SG in the horizontal direction within the cell region, a plurality of storage nodes disposed in the vicinity of intersecting portions between the word lines W0 to W15 and the select gates SG, respectively, below the word lines W0 to W15, and a bit line MGB for transmitting to a sense amplifier 11 information on one of the storage nodes through a selection switch 21. In the main cell division unit 20a, an inversion layer is formed below each of the select gates SG within the cell region by applying a positive voltage to each of the select gates SG. A reference cell array is constituted from a reference cell division unit 30a having a same configuration as the main cell division unit 20a.

11 Claims, 15 Drawing Sheets

FIG. 3

| ADDRESS SIGNAL | MAIN CELL DECODER | REFERENCE CELL DECODER |
|---|---|---|
| 0 | W0 | RW0 |
| 1 | W1 | RW1 |
| 2 | W2 | RW2 |
| 3 | W3 | RW3 |
| 4 | W4 | RW4 |
| 5 | W5 | RW5 |
| 6 | W6 | RW6 |
| 7 | W7 | RW7 |
| 8 | W8 | RW8 |
| 9 | W9 | RW9 |
| 10 | W10 | RW10 |
| 11 | W11 | RW11 |
| 12 | W12 | RW12 |
| 13 | W13 | RW13 |
| 14 | W14 | RW14 |
| 15 | W15 | RW15 |

FIG. 6

| ADDRESS SIGNAL | MAIN CELL DECODER | REFERENCE CELL DECODER |
|---|---|---|
| 0 | W0 | RW0 |
| 1 | W1 | RW1 |
| 2 | W2 | RW2 |
| 3 | W3 | RW3 |
| 4 | W4 | RW4 |
| 5 | W5 | RW5 |
| 6 | W6 | RW6 |
| 7 | W7 | RW7 |
| 8 | W8 | RW7 |
| 9 | W9 | RW6 |
| 10 | W10 | RW5 |
| 11 | W11 | RW4 |
| 12 | W12 | RW3 |
| 13 | W13 | RW2 |
| 14 | W14 | RW1 |
| 15 | W15 | RW0 |

FIG. 7

| ADDRESS SIGNAL | MAIN CELL DECODER | REFERENCE CELL DECODER |
|---|---|---|
| 0 | W0 | RW15 |
| 1 | W1 | RW14 |
| 2 | W2 | RW13 |
| 3 | W3 | RW12 |
| 4 | W4 | RW11 |
| 5 | W5 | RW10 |
| 6 | W6 | RW9 |
| 7 | W7 | RW8 |
| 8 | W8 | RW8 |
| 9 | W9 | RW9 |
| 10 | W10 | RW10 |
| 11 | W11 | RW11 |
| 12 | W12 | RW12 |
| 13 | W13 | RW13 |
| 14 | W14 | RW14 |
| 15 | W15 | RW15 |

MAIN CELL BLOCK (#0~N)

CONVENTIONAL ART 1
PRIOR ART

NON-VOLATILE SEMICONDUCTOR MEMORY DEVICE

FIELD OF THE INVENTION

The present invention relates to a non-volatile semiconductor memory device including sense amplifiers each for amplifying a potential difference between a memory cell array and a reference cell array. More specifically, the invention relates to the non-volatile semiconductor memory device capable of performing high speed reading when a read is executed.

BACKGROUND OF THE INVENTION

Among conventional non-volatile semiconductor memory devices, a non-volatile semiconductor memory device as shown in FIGS. 10 to 11 (conventional art 1) is known. The non-volatile semiconductor memory device in the conventional art 1 includes first diffusion regions 107, select gates 103, second diffusion regions (indicated by reference numeral 121 in FIG. 10), floating gates 106, and control gates 111 (refer to FIGS. 10 and 11).

The first diffusion regions 107 are extended in (below) a surface of a substrate 101, and are provided together, being separated to one another. The first diffusion regions 107 are used as local bit lines. The select gates 103 are disposed in regions between the mutually adjacent first diffusion regions 107 above the substrate 101 via an insulating film 102, and extend in the direction in which the first diffusion regions 107 extend. The second diffusion regions (indicated by reference numeral 121 in FIG. 10) are disposed on the surface of the substrate 101 below the select gates 103 outside cell regions, and extend in a direction that crosses the select gates 103 on both sides outside the cell regions. The second diffusion regions (indicated by reference numeral 121 in FIG. 10) are employed as common sources. The floating gates 106 are storage nodes, and are disposed between the first diffusion regions 107 and the select gates 103, respectively via the insulating film 102. The floating gates 106 are arranged in the form of islands as seen from a direction normal to the plane. The control gates 111 are disposed above the floating gates 106 and the select gates 103 through an insulating film 108, and are disposed together, being separated to one another. The control gates 111 extend in the direction that crosses the select gates 103. The control gates 111 are employed as word lines.

One of the first diffusion regions 107 on both sides of a select gate 103, a floating gate 106, a control gate 111, and the select gate 103 constitute a first unit cell. The other of the first diffusion regions 107 on both sides of the select gate 103, a floating gate 106, the control gate 111, and the select gate 103 constitute a second unit cell. In this non-volatile semiconductor memory device, by applying a positive voltage to the select gate 103, an inversion layer 120 is formed on the surface of the substrate 101 below the select gate 103 in the cell regions.

An operation of the non-volatile semiconductor memory device according to the conventional art 1 will be described with reference to drawings. FIG. 12 is a schematic diagram for explaining about a read operation (read operation when electrons are not stored in a floating gate) from the semiconductor memory device according to the conventional art 1. FIG. 13 is a schematic diagram for explaining about a write operation onto the semiconductor memory device according to the conventional art 1. FIG. 14 is a schematic diagram for explaining about an erase operation from the semiconductor memory device according to the conventional art 1.

Referring to FIG. 12, for a read operation, first, in a state where electrons are not stored in the floating gate 106 (or an erased state; with a low threshold voltage), by applying positive voltages to the control gate 111, select gate 103, and the second diffusion region (indicated by reference numeral 121 in FIG. 10), respectively, electrons e move from the first diffusion region 107 through a channel immediately below the floating gate 106, moves through an inversion layer 120 formed below the select gate 103, and moves to the second diffusion region (indicated by reference numeral 121). On the other hand, in a state where the electrons are stored in the floating gate 106 (or a written state; with a higher threshold voltage), even if the positive voltages are applied to the control gate 111, select gate 103, and second diffusion region (indicated by reference numeral 121 in FIG. 10), respectively, the electrons e do not flow because there is no channel below the floating gate 106 (not shown). Reading is performed by making a judgment on data (whether it has a value of 0 or 1) to see whether the electrons e flow or not.

Referring to FIG. 13, for a write operation, positive high voltages are applied to the control gate 111 and the first diffusion region 107, and a positive low voltage of an extent that causes an electric current flow of 1 μA through a memory cell is applied to the select gate 103. The electrons e thereby move from the second diffusion region (indicated by reference numeral 121 in FIG. 10) to the first diffusion region 107 via the inversion layer 120 formed below the select gate 103. On that occasion, part of the electrons e attain high energy due to an electric field at a boundary between the select gate 103 and the floating gate 106, and thus this part of the electrons e are injected into the floating gate 106 across an insulating film 105 (tunnel oxide film) disposed beneath the floating gate 106.

Referring to FIG. 14, for an erase operation, a negative high voltage is applied to the control gate 111, and a positive high voltage is applied to the substrate 101. The electrons e are thereby drawn from the floating gate 106 to the substrate 101 through the insulating film 105 (tunnel oxide film) disposed beneath the floating gate 106.

Next, an internal circuit of the non-volatile semiconductor memory device according to the conventional art 1 will be described using drawings. FIG. 15 is a circuit diagram schematically showing the internal circuit of the non-volatile semiconductor memory device according to the conventional art 1.

The non-volatile semiconductor memory device includes a main cell region 130, a reference cell region 131, a sensor amplifier 132, a main cell decoder 135, and a reference cell decoder 136.

In the main cell region 130, memory cells shown in FIG. 11 (pairs of first and second memory cells) are arranged in the form of a matrix constituted from m rows (on an X coordinate)×n columns (on a Y coordinate). The first diffusion region (indicated by reference numeral 107 in FIG. 1) in a main cell is electrically connected to the sense amplifier 132 through a main cell local bit line MLB, a main cell block selection switch 133, and a main cell global bit line MGB. The control gates (indicated by reference numeral 111 in FIG. 11) in the main cell region 130 are electrically connected to the main cell decoder 135 via corresponding word lines (data lines) W0 to W15. Incidentally, referring to FIG. 15, reference symbol SG indicates the select gate, while reference symbol CS indicates a common source corresponding to each of the second diffusion regions 121 in FIG. 10.

In the reference cell region 131, one memory cell (one pair of the first and second unit cells) shown in FIG. 11 is arranged. The first diffusion region in a reference cell (indicated by reference numeral 107 in FIG. 11) is electrically connected to the sense amplifier 132 via a reference cell block selection switch 134 and a reference cell global bit line RGB. The control gate (indicated by reference numeral 111 in FIG. 11) in the reference cell region 131 is electrically connected to the reference cell decoder 136 through a corresponding reference cell word line RW.

The sense amplifier 132 amplifies a potential difference between the memory cell global bit line MGB and the reference cell global bit line RGB. The sense amplifier 132 is provided for each main cell global bit line MGB. The main cell decoder 135 applies a voltage to one of word lines W0 to W15 specified by an address signal. The reference cell decoder 136 applies a voltage to the word line RW.

A description will be directed to a case where the address signal indicative of "14" is sent to the main cell decoder 135 and the reference cell decoder 136. When a read operation is performed, in a state where electrons are not stored in floating gates of cells surrounded by a heavy dot-dashed line (i.e. the erased state; with the low threshold voltage) in the main cell region 130, positive voltages are applied to the select gate SG, common sources CS, and word line W14, respectively, and the main cell block selection switch 133 is turned ON. Then, currents from the common sources CS are thereby input to the sense amplifier 132 via paths indicated by heavy dotted lines. On the other hand, in the reference cell region 131, regardless of whether the address signal indicates which address, positive voltages are applied to the select gate SG, common sources CS, and reference cell word line RW, respectively, and the reference cell block selection switch 134 is turned ON. Current from the common source CS is thereby input to the sense amplifier 132 via a path indicated by a heavy dotted line. In the sense amplifier 132, a potential difference between the main cell global bit line MGB and the reference cell global bit line RGB is amplified. The 0/1 judgment is thereby performed based on data output from the sense amplifier 132.

There is also provided other conventional non-volatile semiconductor memory device that includes a first column tree, a second column tree, and a differential amplifier (of conventional art 2; refer to Patent Document 1). The first column tree includes a wiring group to which information on a first memory cell is transmitted. The second column tree includes a wiring group to which information on a second memory cell is transmitted. The differential amplifier amplifies a potential difference between a potential at a data line and a potential at a reference data line. The non-volatile semiconductor memory device further includes a column switching gate. The column switching gate couples the first column tree to the data line and also couples the second column tree to the reference data line when the first memory cell is selected. When the second memory cell is selected, the column switching gate couples the second column tree to the data line and also couples the first column tree to the reference data line. According to conventional art 2, a non-volatile semiconductor memory device having strong noise immunity, in which a capacitance of a main body side can be more accurately adjusted to a capacitance of a reference side, while suppressing an increase in the area of the device, can be obtained.

[Patent Document 1]
JP Patent Kokai Publication No. JP-P-2002-8386A (FIG. 1)

SUMMARY OF THE DISCLOSURE

Though conventional art 1 can be combined with conventional art 2, high speed reading cannot be performed just by matching time constants of the main cell global bit line MGB (column tree) and the reference cell global bit line RGB (column tree). That is, while the main cell global bit line MGB and the reference cell global bit line RGB are generally Al (aluminum) wirings and have resistance values of several 10Ω, respectively, the inversion layer immediately below the select gate SG (indicated by reference numeral 120 in FIG. 10 or a resistance symbol portion in FIG. 15) is generally made of silicon and has a resistance value of several 10 kΩ. Since the resistance value of the inversion layer (indicated by reference numeral 120 in FIG. 10) is much larger than the respective resistance values of the main cell global bit line MGB and the reference cell global bit line RGB, the main cell region 130 is influenced by the length (resistance variations) of the inversion layer (resistance symbol portion in FIG. 15) extending from the common source to the memory cell. On contrast, the inversion layer of the reference cell region 131 operates always at the same resistance value. When the resistance value of the inversion layer in the main cell region 130 does not match the resistance value of the inversion layer in the reference cell region 131, a read margin is reduced due to the influence of the resistance variations in the main cell region 130. Thus, when a read is executed, high speed reading cannot be performed.

Accordingly, there is much desired to be desired in the art.

It is a main object of the present invention to enable high speed reading from a storage node when a read is executed.

In a non-volatile semiconductor memory device according to a first aspect of the present invention including sense amplifiers each amplifying a potential difference between a main cell array and a reference cell array, wherein the main cell array includes one or more main cell division units, each of the one or more main cell division units each comprising:

select gates extending in a first direction;

one or more common sources extending in a second direction that crosses the first direction below the select gates outside a cell region;

a plurality of word lines extending above the select gates in the second direction within the cell region;

a plurality of storage nodes disposed in the vicinity of intersecting portions between the word lines and the select gates, respectively, below the word lines; and a bit line that transmits information on one of the storage nodes to one of the amplifiers through a selection switch. The main cell array comprises one or more main dell division units. In the main cell division unit, an inversion layer is formed below each of the select gates within the cell region by applying a positive voltage to each of the select gates. The reference cell array is constituted from one reference cell division unit having a same configuration as each of the one or more main cell division units. A predetermined current path of each of the one or more main cell division units is configured to have the same resistance and the same capacitance as a corresponding current path of the reference cell division unit.

In a second aspect of the present invention, it is preferred that the non-volatile semiconductor memory device comprises:

a first decoder electrically connected to the word lines disposed for each of the one or more main cell division units, for applying a voltage to one of the word lines corresponding to an address of an address signal in response to input of the address signal; and a second decoder electrically connected to a plurality of word lines disposed for the reference cell division unit, for applying the voltage to one of the plurality of word lines corresponding to the address of the address signal in response to input of the address signal.

In a third aspect of the present invention of the present invention, it is preferred that in the non-volatile semiconductor memory device, the common source comprises a first common source disposed at one end outside the cell region and a second common source disposed at the other end outside the cell region. The non-volatile semiconductor memory device includes:

a first decoder electrically connected to the word lines disposed for each of the one or more main cell division units, for applying a voltage to one of the word lines corresponding to an address of an address signal in response to input of the address signal; and a second decoder electrically connected to the plurality of word lines disposed for the reference cell division unit, for applying the voltage to a predetermined one of the plurality of word lines corresponding to the address of the address signal in response to the address signal.

When the address of the address signal corresponds to one of the plurality of word lines in a first word line group disposed in a location between the first common source and a midpoint between the first common source and the second common source, it is preferable that the second decoder applies a voltage to the corresponding one of the plurality of word lines. When the address of the address signal corresponds to one of the plurality of word lines in a second word line group disposed in a location between the second common source and a midpoint between the first common source and the second common source, it is preferable that the second decoder applies a voltage to one of the plurality of word lines in the first word line group having a resistance value matching a resistance value of a channel in a position of the corresponding one of the plurality of word lines in the second word line group, and that the second decoder does not apply the voltage to any word line of the second word line group.

In a fourth aspect of the present invention, it is preferred that the non-volatile semiconductor memory device comprises:

a first global bit line electrically connected to a corresponding one of the sense amplifiers, electrically connected to a first bit line assigned to each of the one or more main cell division units through a first selection switch, and electrically connected to a second bit line assigned to the reference cell division unit through a second selection switch;

a second global bit line electrically connected to the corresponding one of the sense amplifiers, electrically connected to a third bit line assigned to each of the one or more main cell division units through a third selection switch, and electrically connected to a fourth bit line assigned to the reference cell division unit through a fourth selection switch; and a switching circuit that switches off the second selection switch, switches off the third selection switch, and switches on the fourth selection switch when the first selection switch is turned on, whereas the switching circuit switches off the first selection switch, switches on the second selection switch, and switches off the fourth selection switch when the third selection switch is turned on.

The meritorious effects of the present invention are summarized as follows.

According to the present invention (first through fourth aspects), a variation in currents of a reference cell and a main cell at a time of a read can be reduced. The capacitance and resistance value of the current path of the reference cell can be matched with the capacitance and resistance value of the current path of the corresponding main cell. With this arrangement, a margin can be obtained irrespective of the variation in the cell currents at the time of the read, so that high speed reading becomes possible.

According to the present invention (third aspect), the number of cells used in the reference cell division unit is halved. Thus, a test time for the device at a time of shipment can be reduced, and a total chip cost can be reduced.

According to the present invention (fourth aspect), a parasitic capacitance of the global bit line can be made the same between the main cell and the reference cell. Further, the global bit line dedicated to the reference cell becomes unnecessary, so that a chip size can be reduced. The parasitic capacitance in a main cell side and the parasitic capacitance in a reference cell side are balanced, and a wiring interval between the global bit lines is increased. High speed reading can be thereby achieved.

BRIEF DESCRIPTION OF THE DRAWINGS

FIG. 3 is a table showing relationships between address signals and addresses of word lines to which a main cell decoder and a reference cell decoder of the non-volatile semiconductor memory device according to the first embodiment of the present invention apply a voltage;

FIG. 6 is a first table showing relationships between the address signals and the addresses of the word lines to which the main cell decoder and a reference cell decoder of the non-volatile semiconductor memory device according to the second embodiment of the present invention apply a voltage;

FIG. 7 is a second table showing relationships between the address signals and the addresses of the word lines to which the main cell decoder and the reference cell decoder of the non-volatile semiconductor memory device according to the second embodiment of the present invention apply a voltage;

PREFERRED EMBODIMENTS OF THE INVENTION

First Embodiment

Figure 1A:
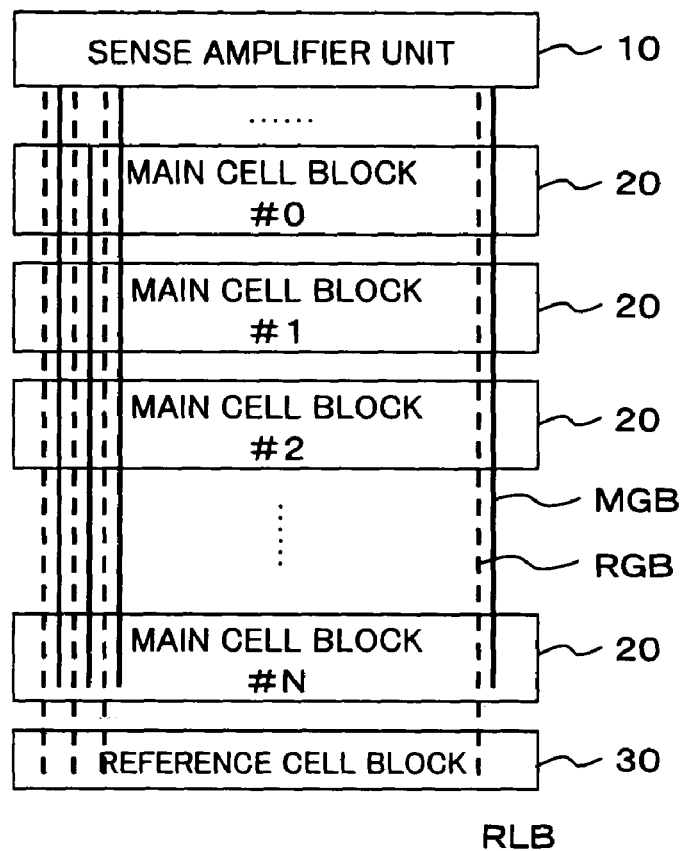
FIGS. 1A, 1B and 1C include block diagrams schematically showing a non-volatile semiconductor memory device according to a first embodiment of the present invention, and FIG. 1A relates to the entire device, FIG. 1B relates to a main cell block, and FIG. 1C relates to a reference cell block.
Figure 1B:
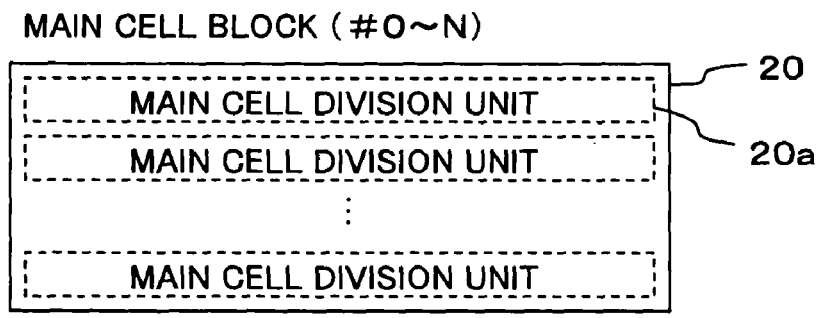
Figure 1C:
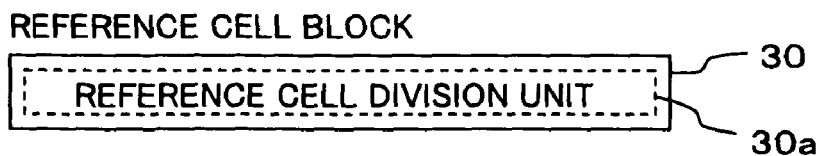
Figure 2:
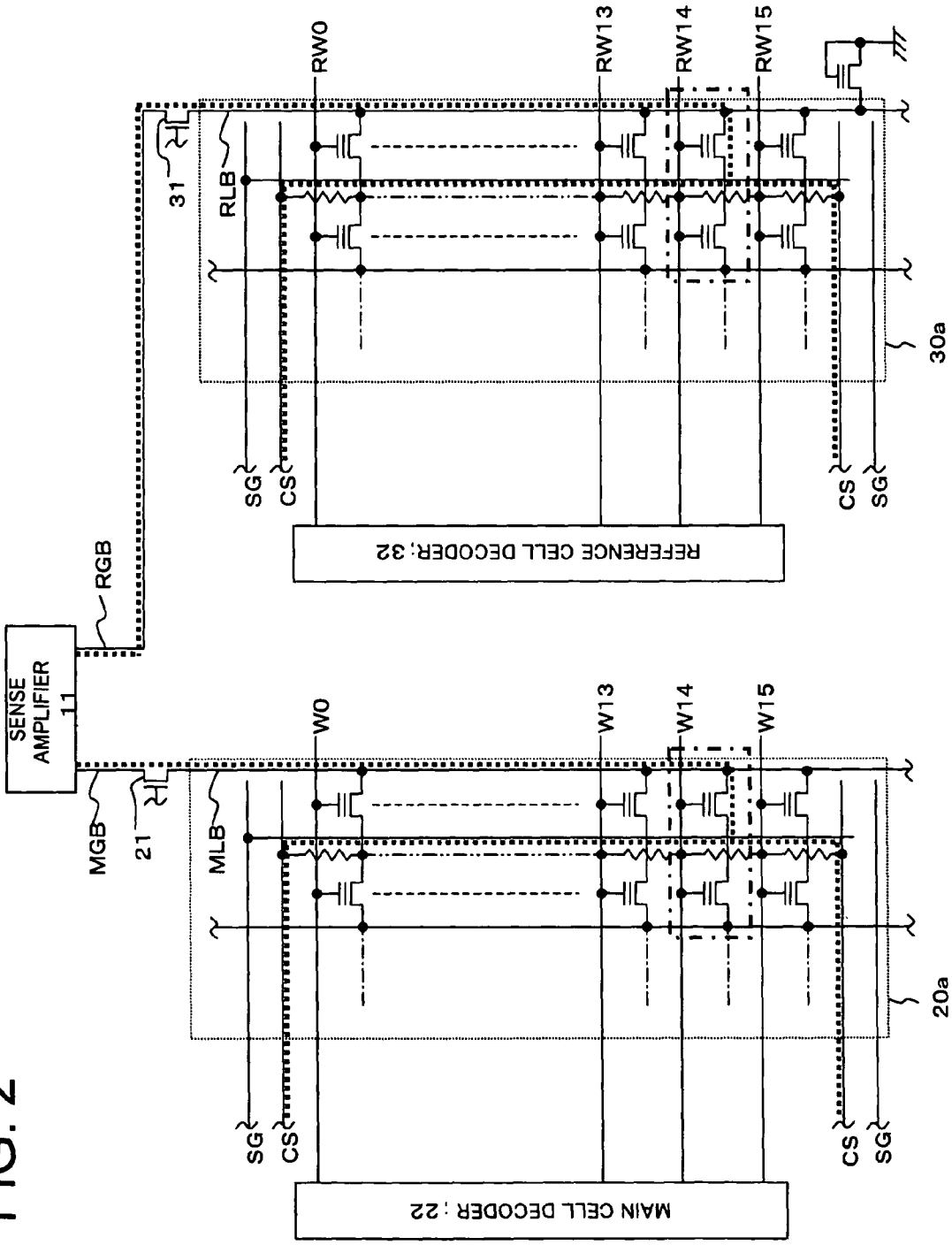
FIG. 2 is a circuit diagram schematically showing an internal circuit of the non-volatile semiconductor memory device according to the first embodiment of the present invention.

A non-volatile semiconductor memory device according to a first embodiment of the present invention will be described using drawings. FIGS. 1A, 1B and 1C include block diagrams schematically showing a configuration of the non-volatile semiconductor memory device in the first embodiment of the present invention. FIG. 1A relates to the entire device. FIG. 1B relates to a main cell block. FIG. 1C relates to a reference cell block. FIG. 2 is a circuit diagram schematically showing an internal circuit of the non-volatile semiconductor memory device according to the first embodiment of the present invention. FIG. 3 is a table showing relationships between addresses of word lines to which a main cell decoder and a reference cell decoder of the non-volatile semiconductor memory device according to the first embodiment of the present invention apply a voltage, and address signals.

The non-volatile semiconductor memory device includes a sense amplifier unit 10, main cell blocks 20, and a reference cell block 30 (refer to FIG. 1A).

The sense amplifier unit 10 is the unit that includes a plurality of sense amplifiers (each indicated by reference numeral 11 in FIG. 2) each for amplifying a potential difference between a main cell global bit line MGB and a reference cell global bit line RGB corresponding thereto (refer to FIG. 1A).

Each main cell block 20 comprises a plurality of unit cells (refer to FIG. 11) and is constituted from the unit cells in which electrons are simultaneously drawn from floating gates thereof (each indicated by reference numeral 106 in FIG. 11) when an erase operation is performed. The main cell blocks 20 are disposed in one volatile semiconductor memory device (refer to FIG. 1A). A plurality of main cell global bit lines MGB and a plurality of reference cell global bit lines RGB are disposed on the main cell block 20. On each main cell block 20, a main cell local bit line (indicated by reference symbol MLB in FIG. 2) that branches from each main cell global bit line MGB and is electrically connected to the main cell global bit line MGB is disposed. Each main cell block 20 is divided into a plurality of main cell division units 20a in one block (refer to FIG. 1B). Each main cell division unit 20a is a memory cell array that is a region sandwiched between two common sources (each indicated by reference symbol CS in FIG. 2) and is constituted from all the unit cells belonging to word lines (such as word lines W0 to W15) from one main cell decoder (main word decoder) (indicated by reference numeral 22 in FIG. 2).

One reference cell block 30 is assigned to a group of the main blocks 20 (refer to FIG. 1A). A plurality of reference cell global bit lines RGB is disposed on the reference cell block 30. On the reference cell block 30, a reference cell local bit line (indicated by reference symbol RLB in FIG. 2) that branches from each reference cell global bit line RGB and is electrically connected to the reference cell global bit line RGB is disposed. The reference cell block 30 is constituted from one reference cell division unit (cell unit) 30a that has a similar configuration as that of the main cell division unit (cell unit) 20a (refer to FIG. 1C).

Figure 10:
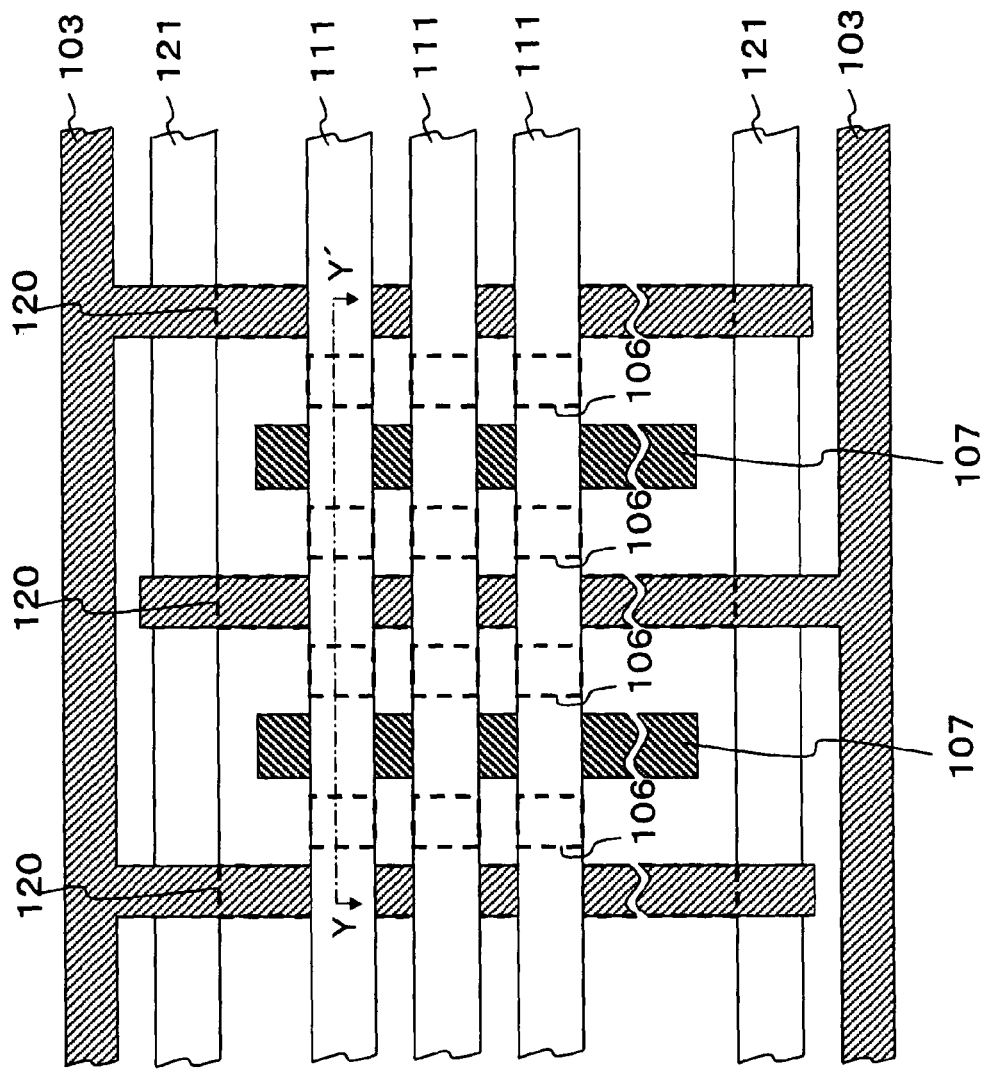
FIG. 10 is a partial plan view schematically showing a configuration of a semiconductor memory device according to conventional art 1.
Figure 11:
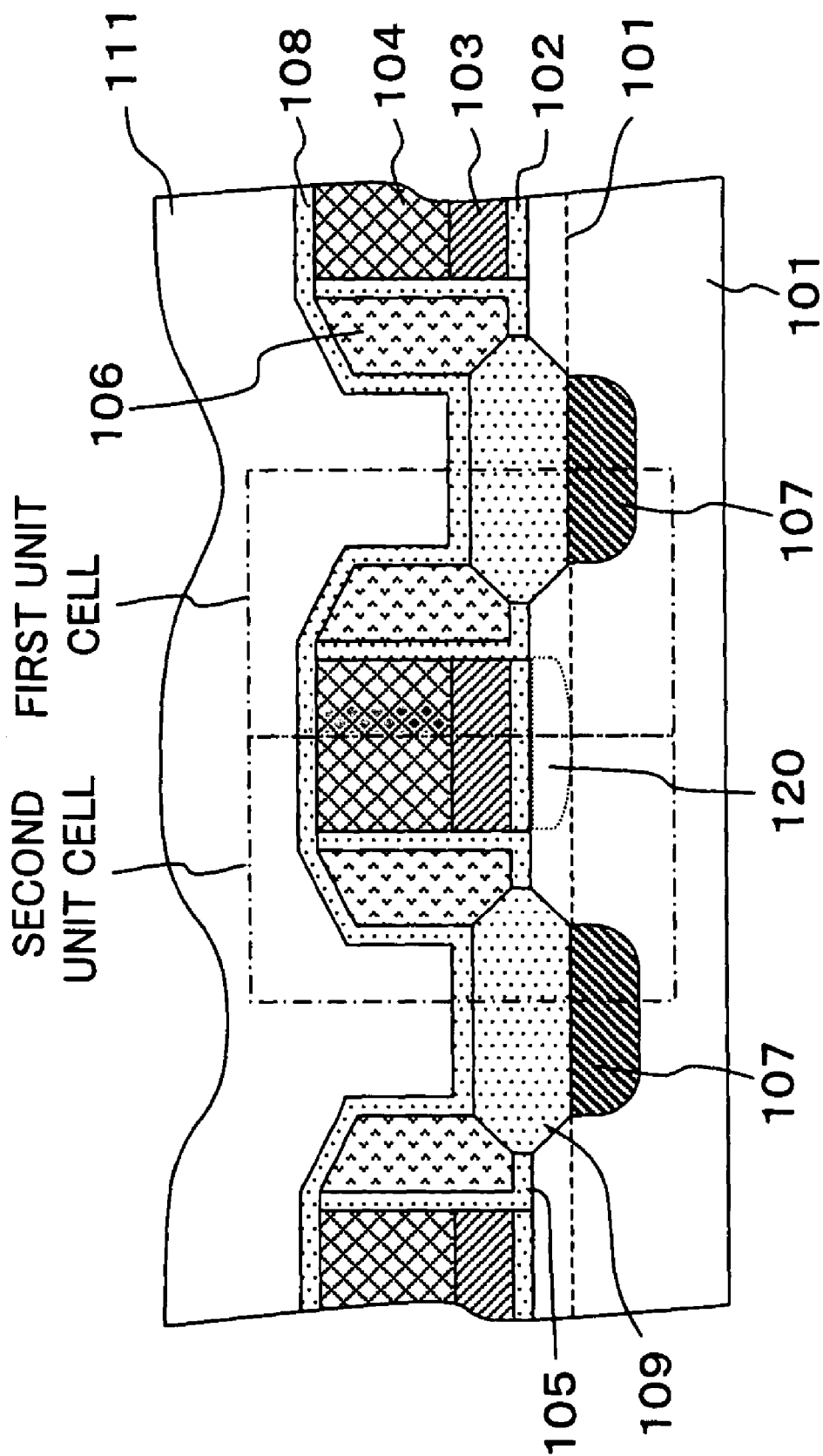
FIG. 11 is a partial sectional view schematically showing a configuration of the semiconductor memory device according to the conventional art 1, taken along a line Y-Y' (in FIG. 10)
Figure 12:
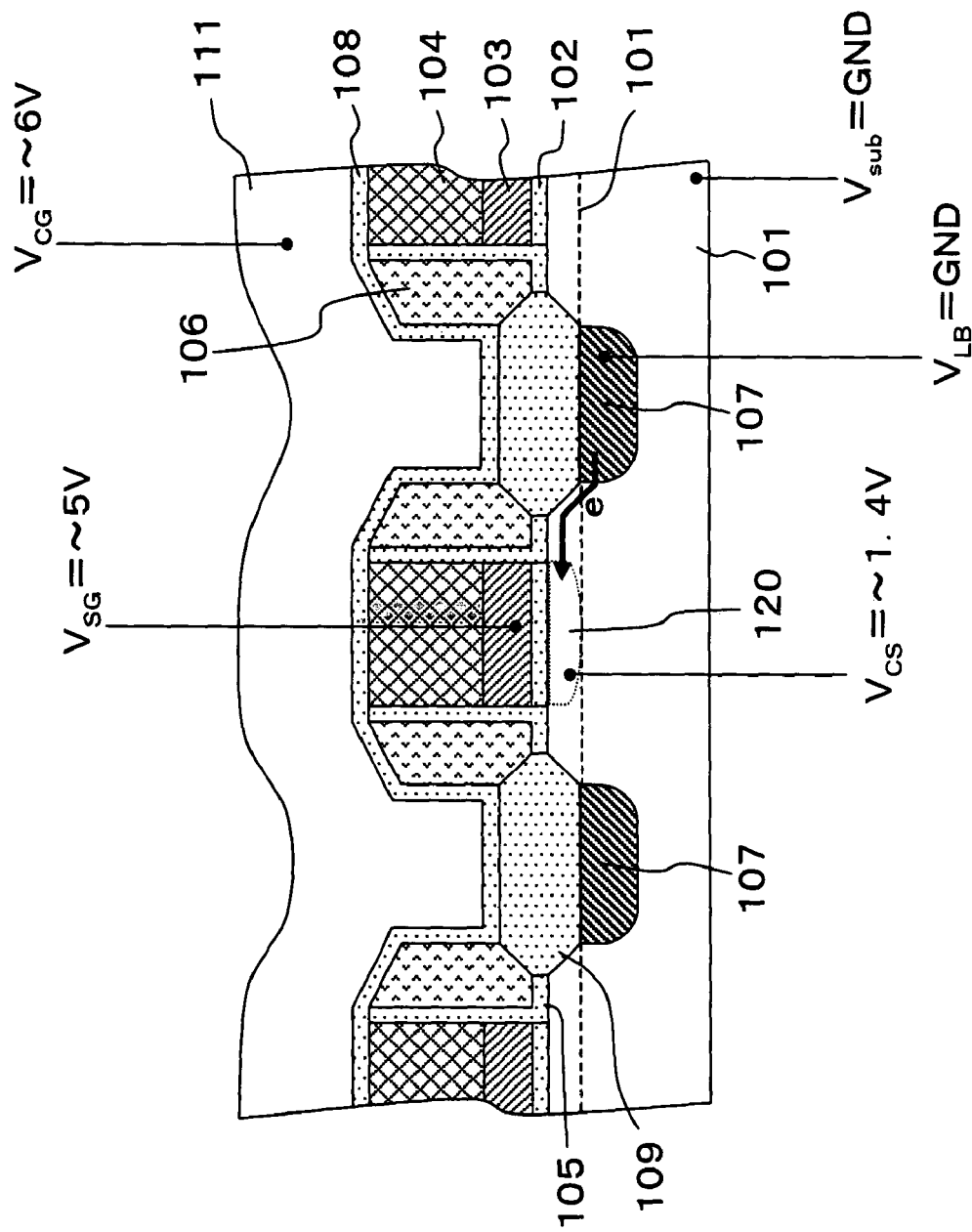
FIG. 12 is a schematic diagram for explaining a read operation (read operation when electrons are not stored in floating gates) of the semiconductor memory device according to the conventional art 1.
Figure 13:
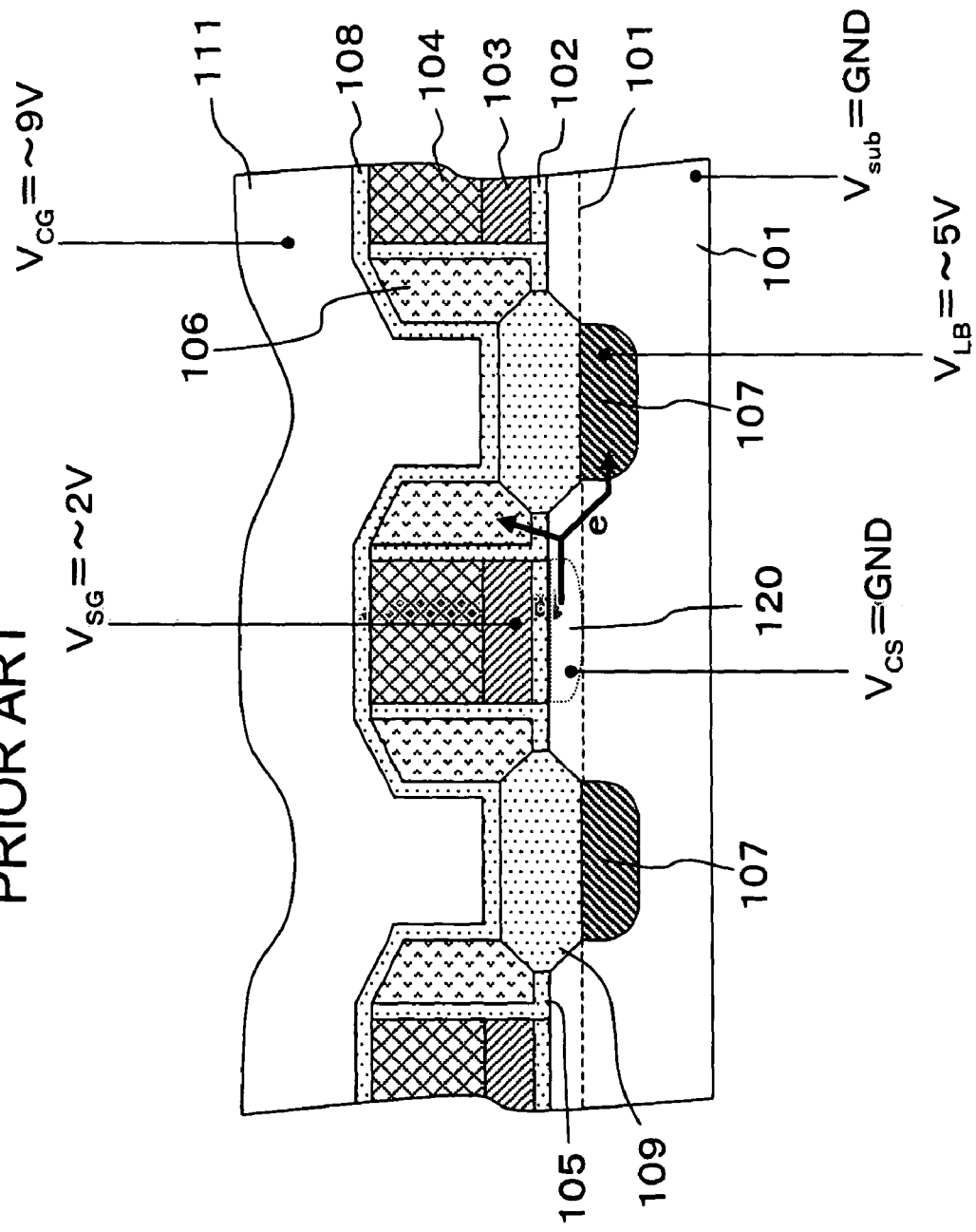
FIG. 13 is a schematic diagram for explaining a write operation of the semiconductor memory device according to the conventional art 1.
Figure 14:
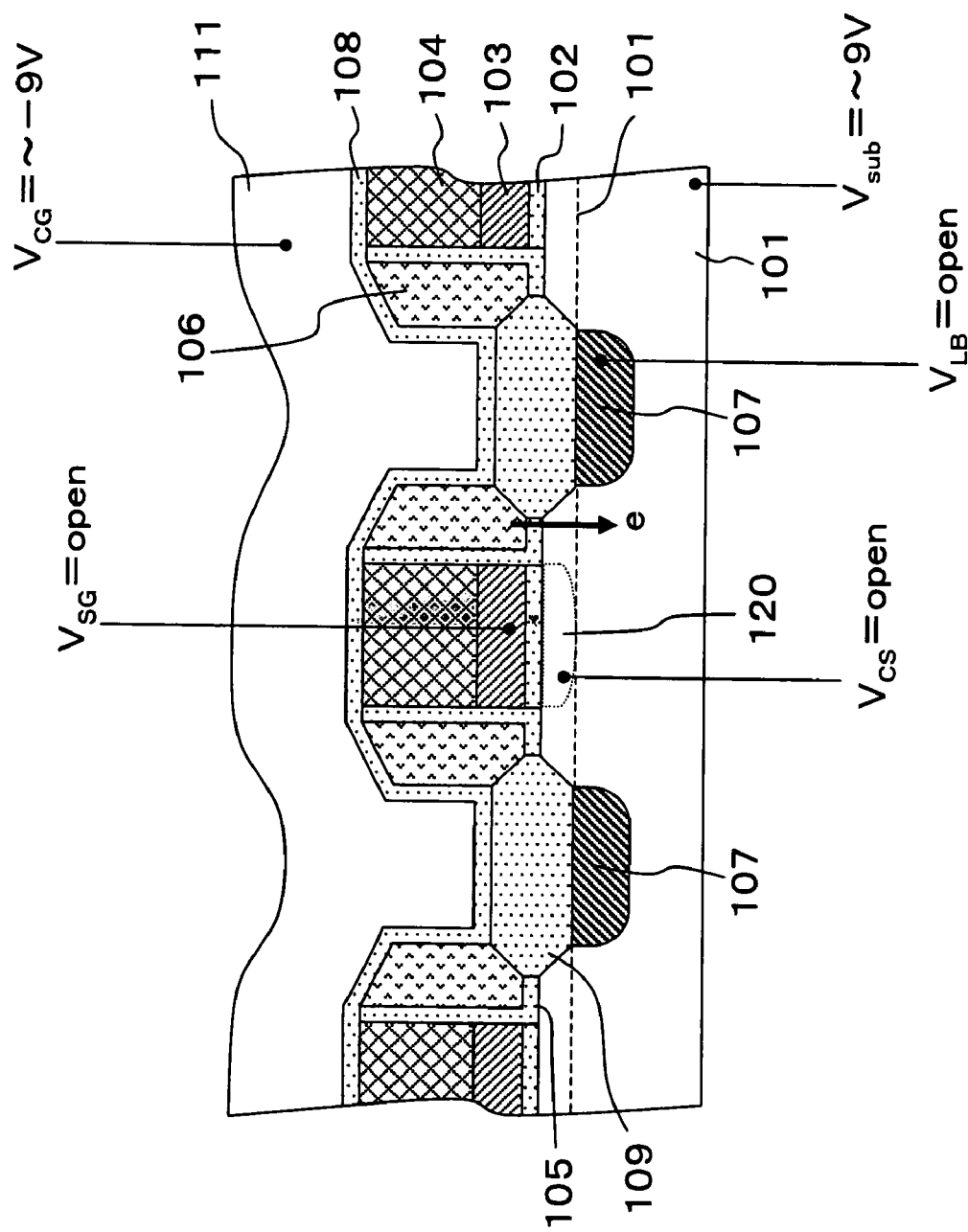
FIG. 14 is a schematic diagram for explaining an erase operation of the semiconductor memory device according to the conventional art 1.
Figure 15:
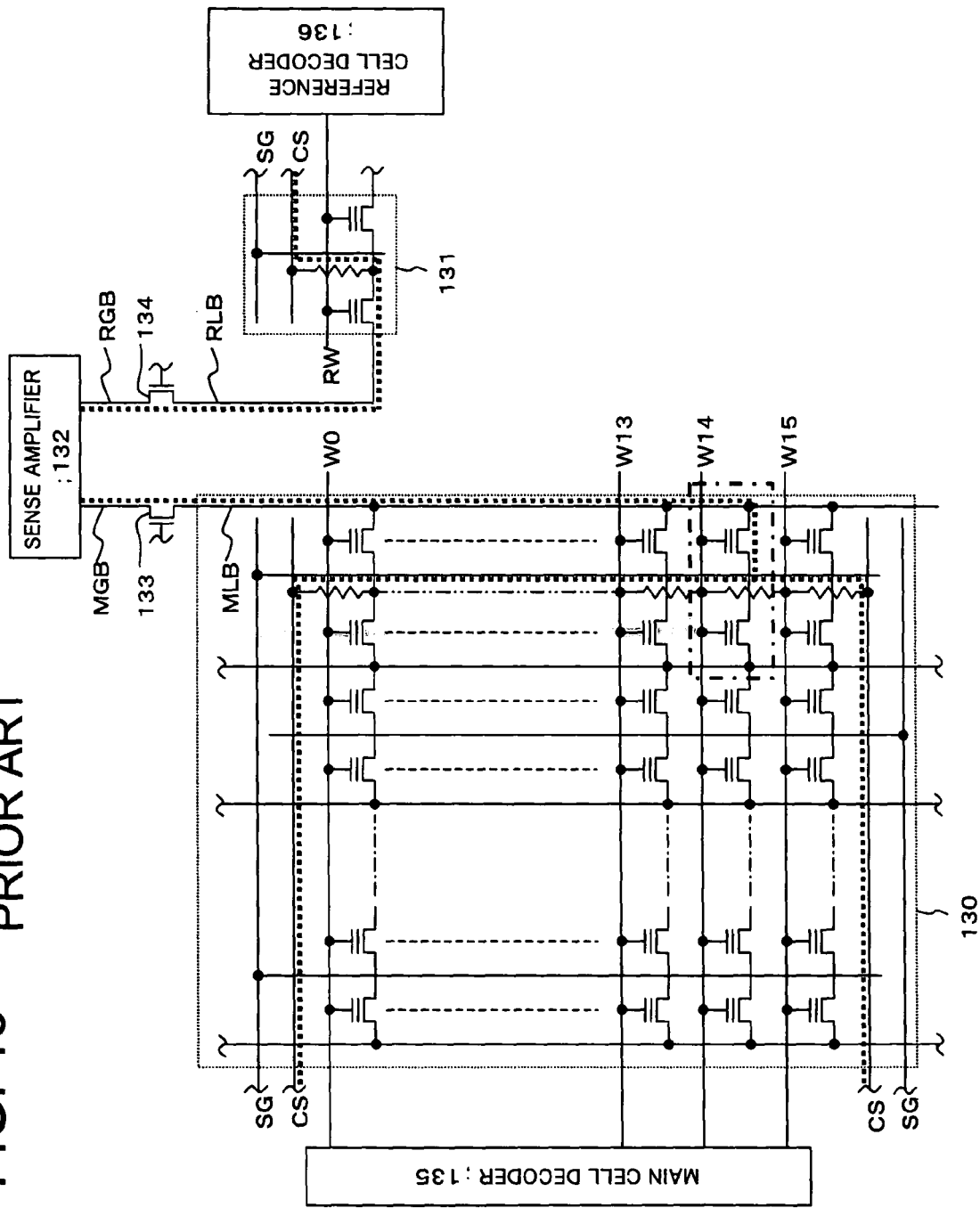
FIG. 15 is a circuit diagram schematically showing an internal circuit of the non-volatile semiconductor memory device according to the conventional art 1.

On each main cell division unit 20a, memory cells (pairs of a first unit cell and a second unit cell) shown in FIG. 11 are disposed in the form of a matrix constituted from m rows (on an X coordinate) and n columns (on a Y coordinate) (refer to FIG. 2). In each main cell division unit 20a, common sources CS are arranged on both outer sides of a cell region. The common sources CS are arranged so that branch lines of select gates SG cross the two common sources CS. In the first embodiment, only one common source CS may be provided on one side of the main cell division unit 20a, instead of providing the two common sources CS. First diffusion regions (each indicated by reference numeral 107 in FIG. 11) in the main cell division unit 20a are electrically connected to a corresponding one of the sense amplifiers 11 through the main cell local bit line MLB, a block selection switch 21, and the main cell global bit line MGB. Control gates (each indicated by reference numeral 111 in FIG. 11) in the main cell division unit 20a are electrically connected to a main cell decoder 22 via the word lines W0 to W15 corresponding thereto, respectively. Incidentally, referring to FIG. 2, a reference symbol SG corresponds to a select gate 103 in FIG. 10, and a reference symbol CS corresponds to the common source corresponding to a second diffusion region 121 in FIG. 10. A configuration of the main cell division unit 20a is the same as a configuration of a main cell region (indicated by reference numeral 130 in FIG. 15) in conventional art 1.

On each reference cell division unit 30a, the memory cells (pairs of the first unit cell and the second unit cell) shown in FIG. 11 are disposed in the form of the matrix constituted from the m rows (on the X coordinate) and the n columns (on the Y coordinate) as on the main cell division unit 20a. In each reference cell division unit 30a, the common sources CS are arranged on both the outer sides of the memory cells. The common sources CS are arranged so that the branch lines of the select gates SG cross the two common sources CS. A configuration of the reference cell division unit 30a is different from a configuration of a reference region (indicated by reference numeral 131 in FIG. 15) in the conventional art 1 in this respect. When the number of the common sources CS of the main cell division unit 20a is only one on one side of the main cell division unit 20a, only one common source CS of the reference cell division unit 30a is provided on one side of the reference cell division unit 30a, which is of the same configuration as that in the case of the common source CS of the main cell division unit 20a. The first diffusion regions (each indicated by reference numeral 107 in FIG. 11) in the reference cell division unit 30a are electrically connected to a corresponding one of the sense amplifiers 11 through a block selection switch 31, and the reference cell global bit line RGB. The control gates (each indicated by reference numeral 111 in FIG. 11) in the reference cell division unit 30a are electrically connected to a reference cell decoder (reference word decoder) 32 through reference cell word lines (data lines) RW0 to RW15 corresponding thereto, respectively. Incidentally, referring to FIG. 2, the reference symbol SG corresponds to the select gate 103 in FIG. 10, and the reference symbol CS corresponds to the common source corresponding to the second diffusion region 121 in FIG. 10. The reference cell division unit 30a has a channel region that is the same as a channel region of the main cell division unit 20a. A current path of the reference cell division unit 30a is configured to have a resistance and a capacitance that are identical to those of a corresponding current path of the main cell division unit 20a.

A sense amplifier 11 is the sense amplifier for reading, in which the main cell global bit line MGB is electrically connected to the corresponding one of the reference cell global bit lines RGB, and the sense amplifier 11 amplifies a potential difference between the main cell global bit line MGB and the reference cell global bit line RGB. The sense amplifier 11 is provided for each main cell global bit line MGB.

The main cell decoder 22 applies a voltage to one of the word lines W0 to W15 specified by an address signal. The main cell decoder 22 is provided for each main cell division unit (indicated by reference numeral 20a in FIG. 1B) of the main cell block (indicated by reference numeral 20 in FIG. 1B).

The reference cell decoder 32 has the same configuration as the main cell decoder 22. The address signal that is the same as the address signal input to the main cell decoder 22 is input to the reference cell decoder 32. The reference cell decoder 32 applies the voltage to one of the word lines RW0 to RW15 specified by the address signal. One reference cell decoder 32 is provided for the reference cell block (indicated by reference numeral 30 in FIG. 1C). The address of a word line to which the reference cell decoder 32 applies a voltage corresponds to the address of a word line to which the main cell decoder 22 (refer to FIG. 3) applies a voltage.

Next, an example of a read operation by the non-volatile semiconductor memory device according to the first embodiment of the present invention will be described. Herein, a description will be given on a case where the address signal input to the main cell decoder 22 and the reference cell decoder 32 is indicative of "14".

In a state where electrons are not stored in floating gates of cells surrounded by a heavy dot-dashed line (i.e. an erased state; with a low threshold voltage) in the main cell division unit 20a, by applying positive voltages to the select gates SG, common sources CS, and word line W14, respectively and turning the block selection switch 21 ON, currents from the common sources CS are input to the sense amplifier 11 through paths indicated by heavy dotted lines (refer to FIG. 2). Herein, a current that flows from a common source CS disposed at a position closer to the word line W14 becomes larger than a current that flows from a common source CS disposed farther away from a word line W14.

On the other hand, in a state where electrons are not stored in floating gates of cells surrounded by a heavy dot-dashed line (i.e. the erased state; with a low threshold voltage) in the reference cell division unit 30a, by applying positive voltages to the select gates SG, common sources CS, and word line RW14, respectively and turning the block selection switch 31 ON, currents from the common sources CS are input to the sense amplifier 11 via paths indicated by heavy dotted lines (refer to FIG. 2). Herein, as in the main cell division unit 20a, a current that flows from a common source CS disposed at a position closer to the word line RW14 becomes larger than the current that flows from a common source CS disposed farther away from the word line RW14.

In the sense amplifier 11, a potential difference between the main cell global bit line MGB and the reference cell global bit line RGB is amplified. The 0/1 judgment is thereby performed based on data output from the sense amplifier 11.

According to the first embodiment, resistance values of the current paths (especially, inversion layers formed below the select gates SG) in the main cell division unit 20a and the reference cell division unit 30a can be made the same. Accordingly, read current variations due to resistance variations can be reduced, so that a read margin can be increased. High speed reading thus can be performed.

Second Embodiment

Figure 4:
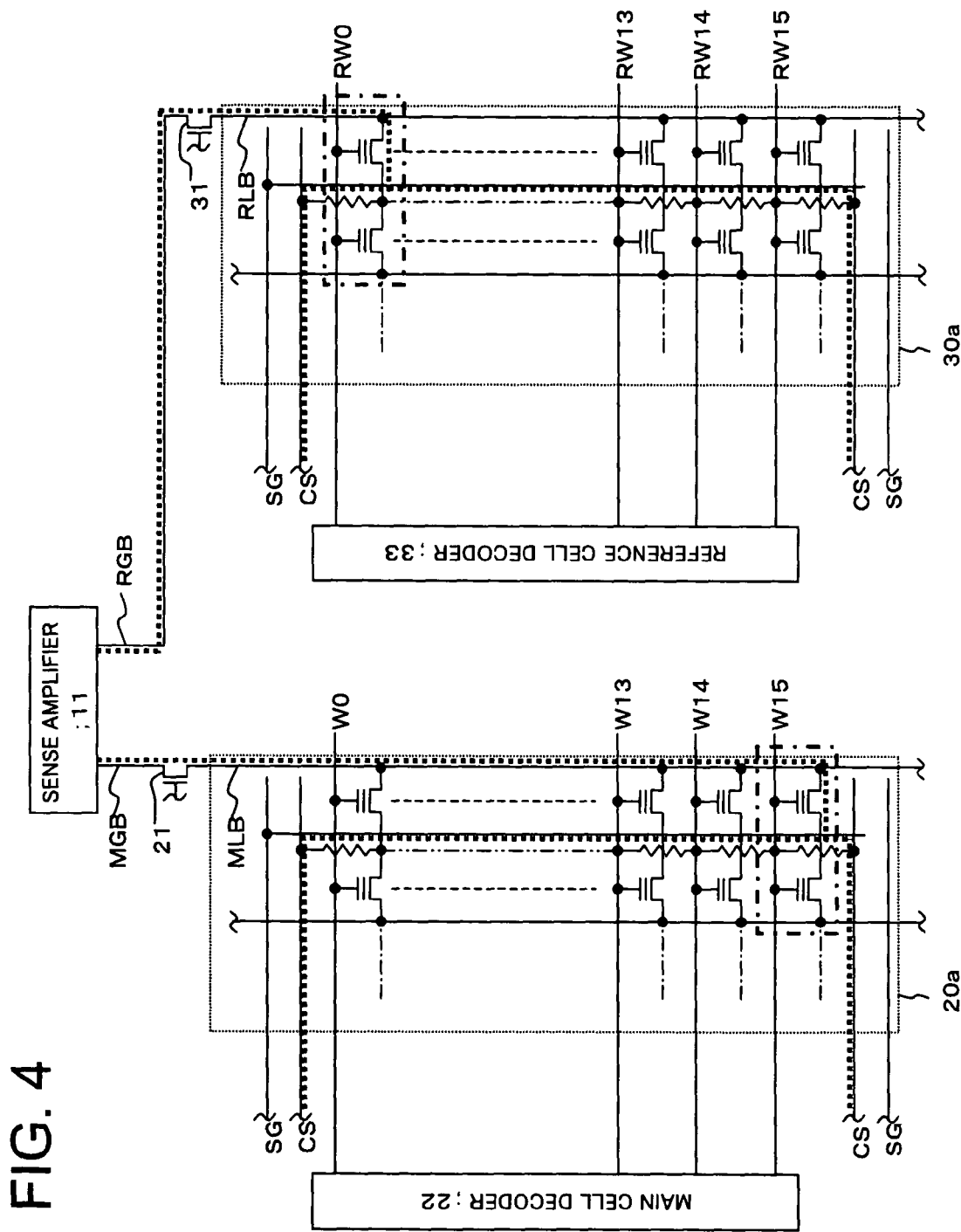
FIG. 4 is a circuit diagram schematically showing an internal circuit of a non-volatile semiconductor memory device according to a second embodiment of the present invention.
Figure 5:
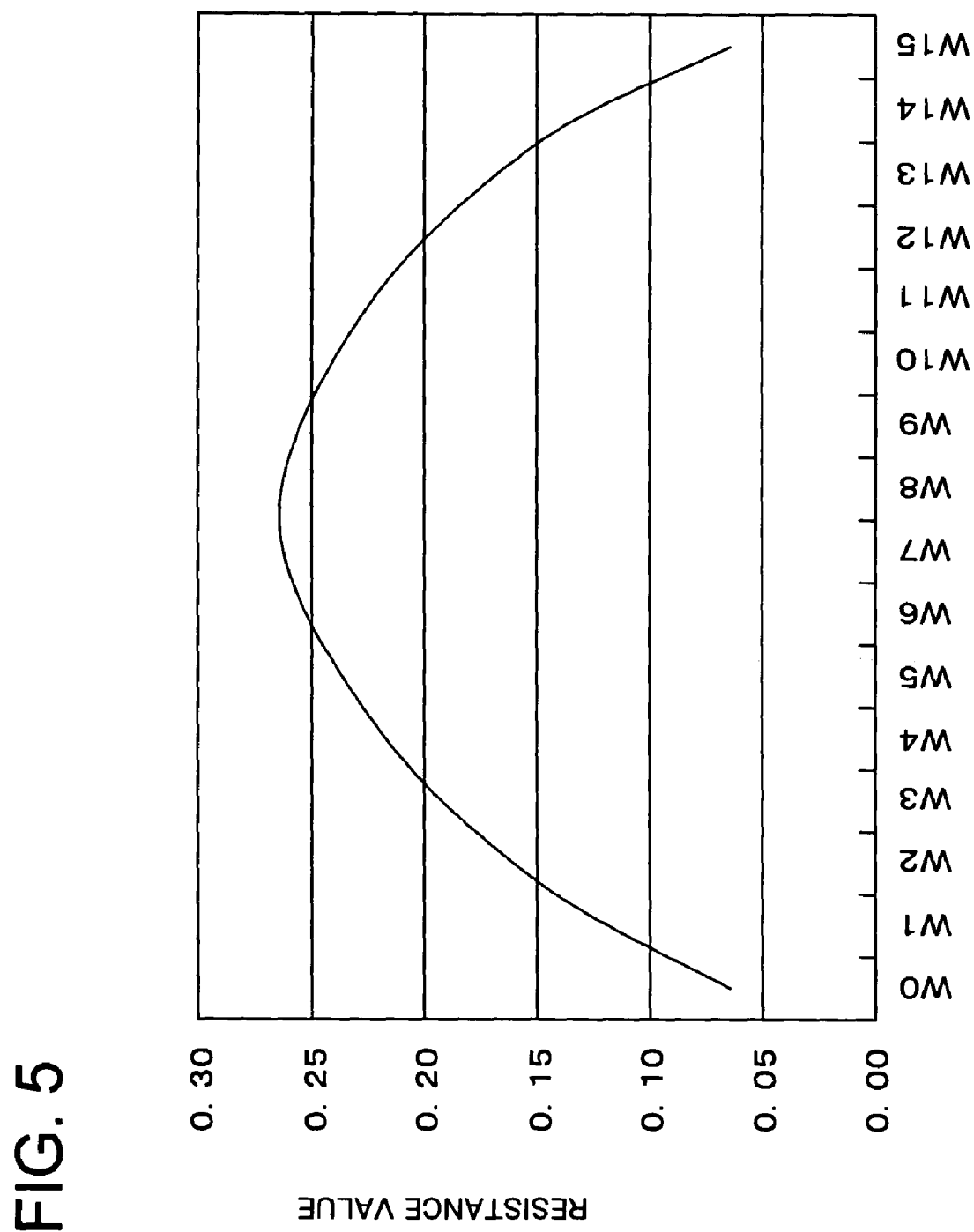
FIG. 5 is a graph showing resistance values at locations of respective word lines when a resistance of an inversion layer between a pair of common sources in the non-volatile semiconductor memory device according to the second embodiment of the present invention is set to one.

A non-volatile semiconductor memory device according to a second embodiment of the present invention will be described with reference to drawings. FIG. 4 is a circuit diagram schematically showing an internal circuit of the non-volatile semiconductor memory device according to the second embodiment of the present invention. FIG. 5 is a graph showing resistance values at locations of the respective word lines when a resistance of an inversion layer between a pair of the common sources in the non-volatile semiconductor memory device according to the second embodiment of the present invention is set to one. FIG. 6 is a first table showing relationships between addresses of the word lines to which the main cell decoder and the reference cell decoder of the non-volatile semiconductor memory device according to the second embodiment of the present invention apply a voltage, and the address signals. FIG. 7 is a second table showing relationships between the addresses of the word lines to which the main cell decoder and the reference cell decoder of the non-volatile semiconductor memory device according to the second embodiment of the present invention apply a voltage, and the address signals.

The non-volatile semiconductor memory device according to the second embodiment is different from the non-volatile semiconductor memory device according to the first embodiment in the reference cell decoder (reference word decoder) (indicated by reference numeral 33 in FIG. 4). The non-volatile semiconductor memory device according to the second embodiment is the same as the non-volatile semiconductor memory device according to the first embodiment in other respects. Incidentally, in the second embodiment, only the non-volatile semiconductor memory device with the two common sources disposed for the main cell division unit 20a and the reference cell division unit 30a, respectively, is employed.

Referring to FIG. 5, the resistance values at the locations of the respective word lines (W0 to W15) when the resistance of the channel region (inversion layer) between the two common sources CS is set to one decreases symmetrically with a peak of the resistance value at a range between the word lines W7 and W8. For example, a resistance value at the location of the word line W0 is the same as a resistance value at the location of the word line W15. Likewise, the resistance values at the locations of the word lines W1, W2, W3, W4, W5, W6, W7 are also the same as the resistance values at the locations of the word lines W14, W13, W12, W11, W10, W9, and W8, respectively.

As described above, paying attention to the resistance values at the locations of the respective word lines (W0 to W15), the reference cell decoder 33 applies a voltage to the corresponding one of the word lines RW0 to RW7 when the address signal that is the same as the address signal input to the main cell decoder 22 is indicative of one of 1 to 7. However, when the address signal is indicative to one of 8 to 15, the reference cell decoder 33 does not apply a voltage to one of the word lines RW8 to RW15, and applies the voltage to one of the word lines RW7 to RW0 (refer to FIG. 6). In order words, the reference cell decoder 33 uses only a first word line group (such as the word lines RW0 to RW7) disposed between one of the two common sources CS and a midpoint between the two common sources, and does not use a second word line group (such as the word lines RW8 to RW15) disposed between the other common source CS and the midpoint between the two common sources CS. The reference cell decoder 33 applies a voltage to one of the word lines in the first word line group having the resistance value that matches with the resistance value at the location of one of the word lines in the second word line group, when the input address signal is associated with one of the second word line group. The second word line group (constituted from the word lines such as the word lines RW8 to RW15) thus becomes dummy word lines. Incidentally, the first word line group that will be used may be set to the word lines RW8 to RW15, and the second word line group that will not be used may be set to the word lines RW0 to RW7 (refer to FIG. 7).

Next, an example of a read operation by the non-volatile semiconductor memory device according to the second embodiment of the present invention will be described. Herein, a description will be directed to a case where the address signal input to the main cell decoder 22 and the reference cell decoder 33 is indicative of "15", and the reference cell decoder 33 applies a voltage to one of the word lines as shown in FIG. 6.

In a state where electrons are not stored in the floating gates of the cells surrounded by a heavy dot-dashed line (i.e. the erased state; with the low threshold voltage) in the main cell division unit 20a, by applying positive voltages to the select gates SG, common sources CS, and word line W15, respectively and turning the block selection switch 21 ON, currents from the common sources CS are input to the sense amplifier 11 via paths indicated by heavy dotted lines (refer to FIG. 4).

On the other hand, in a state where electrons are not stored in the floating gates of the cells surrounded by the heavy dot-dashed line (i.e. the erased state; with the low threshold voltage) in the reference cell division unit 30a, by applying positive voltages to the select gates SG, common sources CS, and word line RW0, respectively, and turning the block selection switch 31 ON, currents from the common sources CS are input to the sense amplifier 11 via paths indicated by heavy dotted lines (refer to FIG. 4).

In the sense amplifier 11, a potential difference between the main cell global bit line MGB and the reference cell global bit line RGB is amplified. The 0/1 judgment is thereby performed based on data output from the sense amplifier 11.

According to the second embodiment, the same effect as that in the first embodiment is achieved. Together with this, the number of cells in the reference cell division unit 30a is reduced to a half of the number of the cells in the first embodiment. Thus, a device test time at a time of shipment can be reduced, so that a total chip cost can be reduced.

Third Embodiment

Figure 8A:
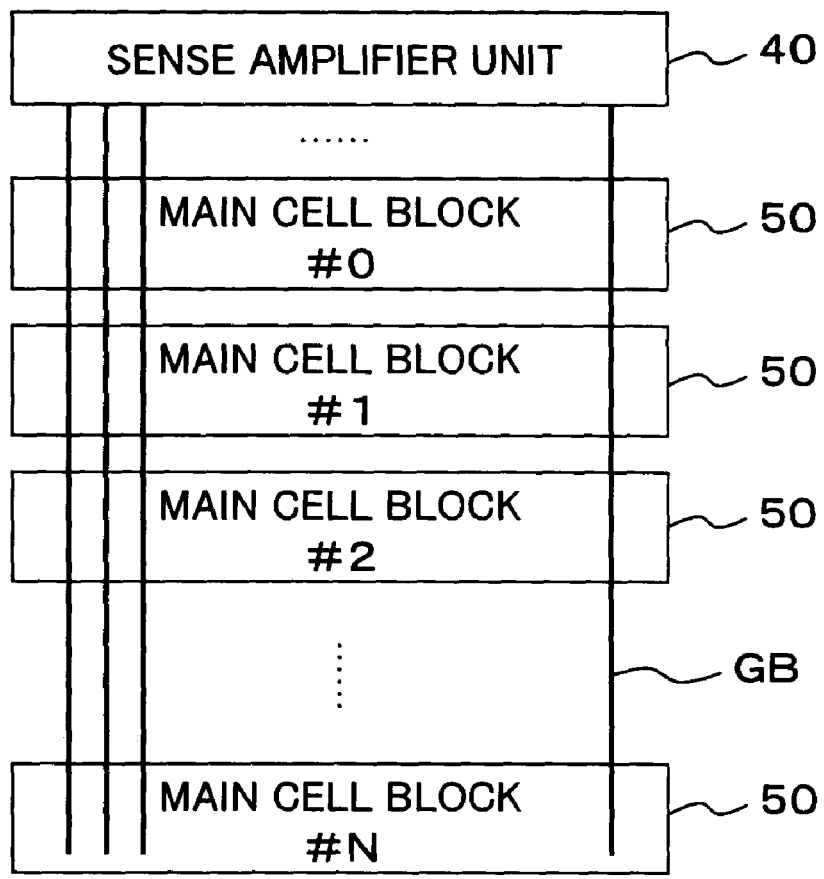
FIGS. 8A and 8B includes block diagrams schematically showing a non-volatile semiconductor memory device according to a third embodiment of the present invention, and FIG. 8A relates to the entire device, and FIG. 8B relates to a main cell block.
Figure 8B:
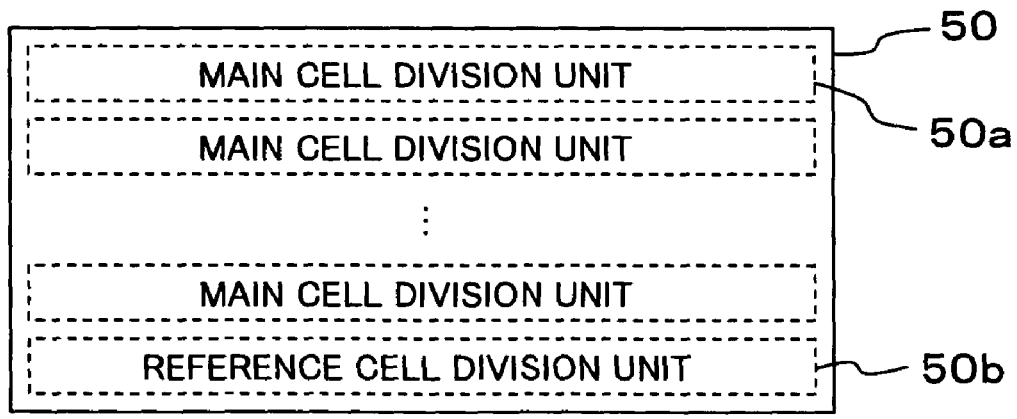
Figure 9:
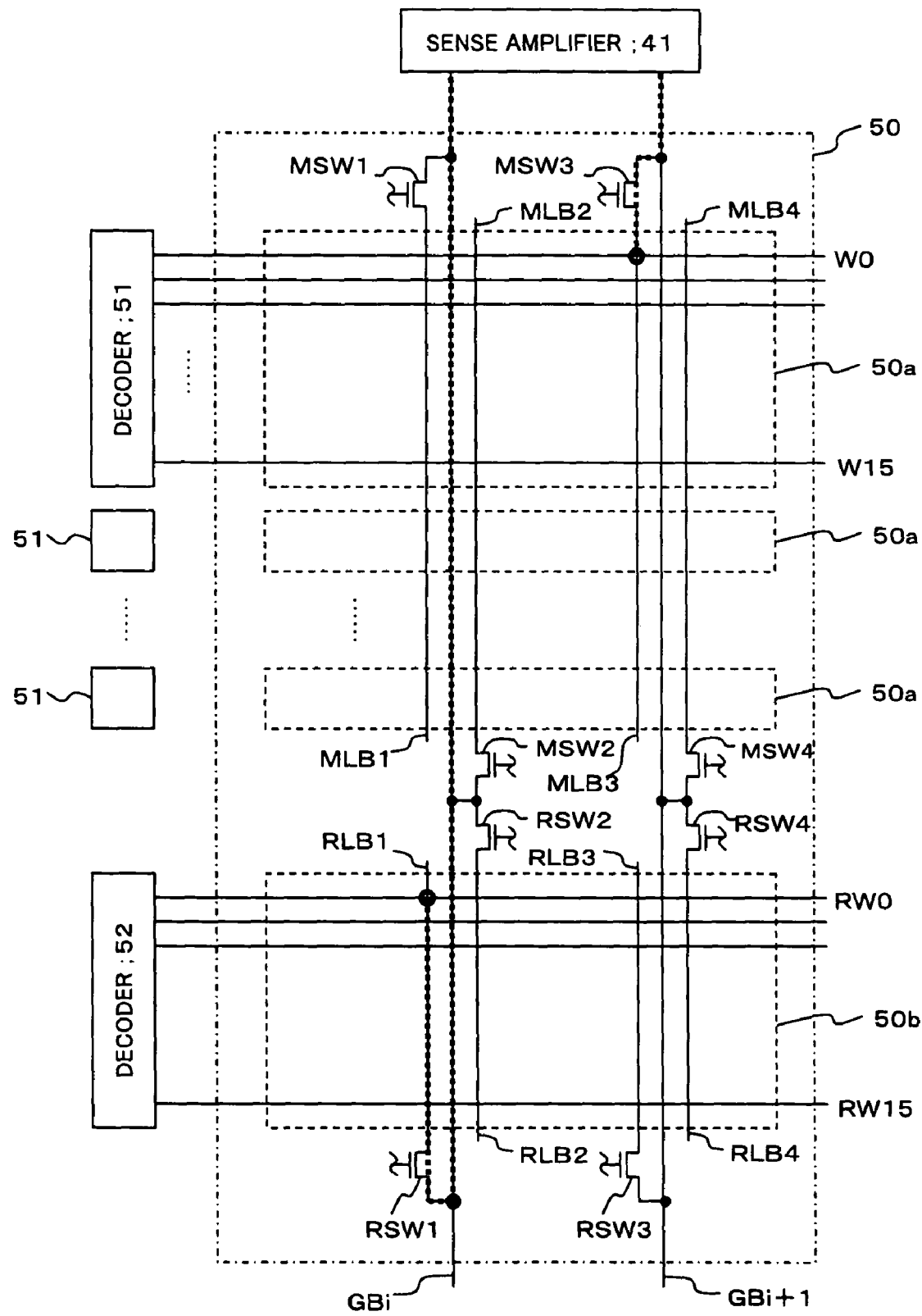
FIG. 9 is a circuit diagram schematically showing the internal circuit of the non-volatile semiconductor memory device according to the third embodiment of the present invention.

A non-volatile semiconductor memory device according to a third embodiment of the present invention will be described using drawings. FIGS. 8A and 8B include block diagrams schematically showing a configuration of the non-volatile semiconductor memory device according to the third embodiment of the present invention. FIG. 8A relates to the entire device, and FIG. 8B relates to a main cell block. FIG. 9 is a circuit diagram schematically showing an internal circuit of the non-volatile semiconductor storage device according to the first embodiment of the present invention.

The non-volatile semiconductor memory device includes a sense amplifier unit 40 and main cell blocks 50 (refer to FIG. 8A).

The sense amplifier unit 40 is the unit that includes a plurality of sense amplifiers (one of which is indicated by reference numeral 41 in FIG. 9) each for amplifying a potential difference between a global bit line $GB_i$ and a global bit line $GB_{i+1}$ (refer to FIG. 1A).

A main cell block 50 is constituted from a plurality of unit cells (refer to FIG. 11), and is constituted from the unit cells each with electrons simultaneously drawn from floating gates thereof (indicated by reference numeral 107 in FIG. 11) when an erase operation is performed. The main cell blocks 50 are disposed within one non-volatile semiconductor memory device (refer to FIG. 8A). On the main cell block 50, a plurality of global bit lines GB (such as the ith global bit line $GB_i$ and (i+1)th global bit line $GB_{i+1}$) are disposed. The main cell block 50 is divided into a plurality of main cell division units (cell units) 50a and one reference cell division unit (cell unit) 50b within one block (refer to FIG. 8B). A main cell division unit 50a is the same as the main cell division unit (indicated by reference numeral 20a in FIG. 1B) in the first embodiment. The reference cell division unit 50b is the same as the reference cell division unit (indicated by reference numeral 30a in FIG. 1C) in the first embodiment. A current path of the reference cell division units 50b is configured to have the same resistance and the same capacitance as the current path of the main cell division units 50a.

A local bit line MLB1 is electrically connected to the global bit line $GB_i$ through a selection switch MSW1. A local bit line MLB2 is electrically connected to the global bit line $GB_i$ via a selection switch MSW2. A local bit line RLB1 is electrically connected to the global bit line $GB_i$ via a selection switch RSW1. A local bit line RLB2 is electrically connected to the global bit line $GB_i$ via a selection switch RSW2 (refer to FIG. 9). A local bit line MLB3 is electrically connected to the global bit line $GB_{i+1}$ via a selection switch MSW3. A local bit line MLB4 is electrically connected to the global bit line $GB_{i+1}$ via a selection switch MSW4. A local bit line RLB3 is electrically connected to the global bit line $GB_{i+1}$ through a selection switch RSW3. A local bit line RLB4 is electrically connected to the global bit line $GB_{i+1}$ through a selection switch RSW4.

The local bit line MLB1, local bit line MLB2, local bit line MLB3, and local bit line MLB4 are disposed on each main cell division unit 50a (refer to FIG. 9). The local bit line RLB1, local bit line RLB2, local bit line RLB3, and local bit line RLB4 are disposed on each reference cell division unit 50b (refer to FIG. 9).

The sense amplifiers 41 are the sense amplifiers for reading, to which the global bit line $GB_i$ and the corresponding global bit line $GB_{i+1}$ are electrically connected. Each sense amplifier 41 amplifies a potential difference between the global bit line $GB_i$ and the global bit line $GB_{i+1}$ (refer to FIG. 9). The sense amplifier 41 is provided for each combination of the global bit line $GB_i$ and the global bit line $GB_{i+1}$.

A decoder 51 applies a voltage to one of the word lines W0 to W15 specified by the address signal. A decoder 51 is provided for each main cell division unit 50a. The decoder 52 has the same configuration as that of the decoder 51. The address signal that is the same as the address signal input to the decoder 51 is input, and the decoder 52 applies a voltage to one of the word lines RW0 to RW15 specified by the address signal. The decoder 52 is provided for each reference cell division unit 50b. The address of one of the word lines to which the decoder 52 applies a voltage corresponds to the address of one of the word lines to which the decoder 51 applies a voltage (refer to FIG. 3).

Next, an example of a read operation by the non-volatile semiconductor memory device according to the third embodiment of the present invention will be described.

Herein, a description will be directed to a case where the address signal input to the decoder 51 and the decoder 52 is indicative of "0".

In order to supply a current from a cell that belongs to the word line W0, surrounded by a heavy circle to the sense amplifier 41 in the main cell division unit 50a, only the selection switch MSW3 among the selection switches connected to the global bit line $GB_{i+1}$ is turned ON, and the selection switches MSW4, RSW3, and RSW4 are turned OFF. The current from the cell that belongs to the word line W0, surrounded by the heavy circle is input to the sense amplifier 41 via the local bit line MLB3, selection switch MSW3, and global bit line $GB_{i+1}$.

On the other hand, in order to supply a current from a cell that belongs to the word line RW0, surrounded by a heavy circle to the sense amplifier 41 in the reference cell division unit 50b, only the selection switch RSW1 among the selection switches connected to the global bit line $GB_i$ is turned ON, and the selection switches MSW1, MSW2, and RSW2 are turned OFF. The current from the cell that belongs to the word line RW0, surrounded by the heavy circle is input to the sense amplifier 41 via the local bit line RLB1, selection switch RSW1, and global bit line $GB_i$.

In the sense amplifier 41, a potential difference between the global bit line $GB_i$ and the global bit line $GB_{i+1}$ is amplified. The 0/1 judgment is thereby performed based on data output from the sense amplifier 41.

Incidentally, switching among the selection switches MSW1 to MSW4, switching among the selection switches RSW1 to RSW4 are performed by a switching circuit (not shown), respectively.

According to the third embodiment, the following effects are achieved.

Parasitic capacitances of the global bit lines GB in a main cell and a reference cell can be made the same. It is because, as the parasitic capacitances of the global bit lines GB, diffusion layer capacitances of the selection switches MSW and RSW are formed in addition to capacitances of wirings themselves. Further, a global bit line dedicated to the reference cell is not provided, and parasitic capacitances corresponding to the total diffusion layer capacitances of the selection switches MSW for main cells are formed. A parasitic capacitance balance between a main cell side and a reference cell side can be thereby achieved, so that high speed reading can be performed.

Further, global bit lines dedicated to reference cells become unnecessary, so that a chip size can be reduced. That is, when the global bit lines dedicated to referencing are provided, a dummy selection switch or switches may be provided so as to adjust the parasitic capacitances. However, by not providing the global bit lines dedicated to the referencing, the parasitic capacitances can be adjusted without providing the dummy selection switch. Reduction in the chip size is thereby achieved. Further, the number of the global bit lines disposed on a main sector is reduced. Design latitude can be thereby increased. When a wiring interval is small, a parasitic capacitance may be formed between adjacent wirings. However, by increasing the wiring interval between the global bit lines, the parasitic capacitance between the adjacent global bit lines can be reduced. Reduction in the parasitic capacitance between the adjacent global bit lines reduces an influence on other cell from which reading is simultaneously performed. Thus, higher speed reading can be achieved.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device, comprising:
a main cell array having a plurality of first cells;
a reference cell array having a plurality of second cells, said first cells and said second cells having respective resistance values associated therewith, said respective resistance values being related to address signals;
a sense amplifier coupled to said memory cell array and said reference cell array to compare one of said first cells and another of said second cells during a read mode; and
a decoder coupled to receive said address signals to select said one of said first cells and said another of said second cells such that said respective resistance values of said one and said another cells are a same value with each other during said read mode,
wherein said plurality of second cells of said reference cell array have resistance that are symmetrically balanced, so that a resistance corresponding to an arbitrary one of said first cells can be selected from approximately only half of said second cells.

2. A semiconductor memory device, comprising:
a main cell array having a plurality of first cells;
a reference cell array having a plurality of second cells, said first cells and said second cells having respective resistance values associated therewith, said respective resistance values being related to address signals;
a sense amplifier coupled to said memory cell array and said reference cell array to compare one of said first cells and another of said second cells during a read mode; and
a decoder coupled to receive said address signals to select said one of said first cells and said another of said second cells such that said respective resistance values of said one and said another cells are a same value with each other during said read mode, wherein said first cells of said main cell array comprise:
select gates extending in a first direction;
one or more common sources extending in a second direction that crosses the first direction below the select gates outside a cell region;
a plurality of word lines extending above the select gates in the second direction within the cell region;
a plurality of storage nodes disposed in a vicinity of intersecting portions between the word lines and the select gates, respectively, below the word lines; and
a bit line that transmits information on one of the storage nodes to one of said amplifiers through a selection switch,
wherein said main cell array comprises one or more main cell division units in which an inversion layer is formed below each of the select gates within the cell region by applying a positive voltage to said each of the select gates, said inversion layer becoming a portion of said bit line during an operation of said main cell array, and
wherein said reference cell array comprises one reference cell division unit having a same configuration as said each of said one or more main cell division units,
such that a predetermined current path of said each of said one or more main cell division units is configured to have a same resistance and a same capacitance as a corresponding current path of said one reference cell division unit.

3. The semiconductor memory device of claim 2, wherein said decoder comprises:
- a first decoder controlling access to said main cell array; and
- a second decoder controlling access to said reference cell array.

4. The semiconductor memory device according to claim 2, wherein the common sources comprise a first common source disposed at one end outside the cell region and a second common source disposed at the other end outside the cell region, said decoder comprising:
- a first decoder that is electrically connected to the word lines disposed for said each of said one or more main cell division units, and that applies a voltage to one of the word lines corresponding to an address of an address signal in response to an input of the address signal; and
- a second decoder that is electrically connected to a plurality of word lines disposed for the reference cell division unit, and that applies the voltage to a predetermined one of said plurality of word lines corresponding to the address of the address signal in response to the address signal, such that:
- when the address of the address signal corresponds to one of said plurality of word lines in a first word line group disposed in a location between the first common source and a midpoint between the first common source and the second common source, the second decoder applies a voltage to the corresponding one of said plurality of word lines, and
- when the address of the address signal corresponds to one of said plurality of word lines in a second word line group disposed in a location between the second common source and a midpoint between the first common source and the second common source, the second decoder applies a voltage to one of said plurality of word lines in the first word line group having a resistance value matching a resistance value of a channel in a position of the corresponding one of said plurality of word lines in the second word line group, and the second decoder does not apply the voltage to any word line of the second word line group.

5. The semiconductor memory device according to claim 2, wherein said main cell array comprises a plurality of main cell division units, said reference cell array comprises one reference cell division unit having a same configuration as said each of said one or more main cell division units, and said sense amplifier comprises one of a plurality of sense amplifiers, said semiconductor memory device further comprising:
- a first global bit line electrically connected to a corresponding one of said sense amplifiers, electrically connected to a first bit line assigned to said each of said one or more main cell division units through a first selection switch, and electrically connected to a second bit line assigned to the reference cell division unit through a second selection switch;
- a second global bit line electrically connected to the corresponding one of said sense amplifiers, electrically connected to a third bit line assigned to said each of said one or more main cell division units through a third selection switch, and electrically connected to a fourth bit line assigned to the reference cell division unit through a fourth selection switch; and
- a switching circuit that switches off the second selection switch, switches off the third selection switch, and switches on the fourth selection switch when the first selection switch is turned on, whereas said switching circuit switches off the first selection switch, switches on the second selection switch, and switches off the fourth selection switch when the third selection switch is turned on.

6. A semiconductor memory device, comprising:
- a main cell array having a plurality of first cells;
- a reference cell array having a plurality of second cells, said first cells and said second cells having respective resistance values associated therewith, said respective resistance values being related to address signals;
- a sense amplifier coupled to said memory cell array and said reference cell array to compare one of said first cells and another of said second cells during a read mode; and
- a decoder coupled to receive said address signals to select said one of said first cells and said another of said second cells such that said respective resistance values of said one and said another cells are a same value with each other during said read mode,
- wherein said semiconductor memory device comprises a non-volatile memory device, wherein each unit of memory comprises a floating gate such that a channel is formed below a floating gate only if electrons are stored therein, and wherein data paths of said selected first cell and said selected second cell comprise respectively at least one section of an inversion layer having a high resistance value and at least one section of a metal conductor having a low resistance value compared to the high resistance value of said inversion layer, said inversion layer conducting electrons during a read operation involving said floating gate only if said channel exists due to electrons being stored in said floating gate.

7. The semiconductor device of claim 6, wherein said semiconductor memory device is non-volatile.

8. The semiconductor memory device of claim 6, as including sense amplifiers each amplifying a potential difference between said main cell array and said reference cell array, wherein said main cell array includes one or more main cell division units, each of said one or more main cell division units comprising:
- select gates extending in a first direction;
- one or more common sources extending in a second direction that crosses the first direction below the select gates outside a cell region;
- a plurality of word lines extending above the select gates in the second direction within the cell region;
- a plurality of storage nodes disposed in a vicinity of intersecting portions between the word lines and the select gates, respectively, below the word lines; and
- a bit line that transmits information on one of the storage nodes to one of said amplifiers through a selection switch;
- wherein said main cell array comprises one or more main cell division units in which an inversion layer is formed below each of the select gates within the cell region by applying a positive voltage to said each of the select gates;
- said reference cell array comprises one reference cell division unit having a same configuration as said each of said one or more main cell division units; and
- a predetermined current path of said each of said one or more main cell division units is configured to have a same resistance and a same capacitance as a corresponding current path of said one reference cell division unit.

9. The semiconductor memory device according to claim 8, said decoder comprising:
- a first decoder that is electrically connected to the word lines disposed for said each of said one or more main cell division units, and that applies a voltage to one of the word lines corresponding to an address of an address signal in response to an input of the address signal; and a second decoder that is electrically connected to a plurality of word lines disposed for the reference cell division unit, and that applies a voltage to one of said plurality of word lines corresponding to the address of the address signal in response to the input of the address signal.

10. The semiconductor memory device according to claim 8, wherein the common source comprises a first common source disposed at one end outside the cell region and a second common source disposed at the other end outside the cell region, said semiconductor memory device comprising:

a first decoder that is electrically connected to the word lines disposed for said each of said one or more main cell division units, and that applies a voltage to one of the word lines corresponding to an address of an address signal in response to an input of the address signal; and a second decoder that is electrically connected to a plurality of word lines disposed for the reference cell division unit, and that applies the voltage to a predetermined one of said plurality of word lines corresponding to the address of the address signal in response to the address signal;

when the address of the address signal corresponds to one of said plurality of word lines in a first word line group disposed in a location between the first common source and a midpoint between the first common source and the second common source, the second decoder applies a voltage to the corresponding one of said plurality of word lines; and when the address of the address signal corresponds to one of said plurality of word lines in a second word line group disposed in a location between the second common source and a midpoint between the first common source and the second common source, the second decoder applies a voltage to one of said plurality of word lines in the first word line group having a resistance value matching a resistance value of a channel in a position of the corresponding one of said plurality of word lines in the second word line group, and the second decoder does not apply the voltage to any word line of the second word line group.

11. The semiconductor memory device according to claim 8, further comprising:

a first global bit line electrically connected to a corresponding one of said sense amplifiers, electrically connected to a first bit line assigned to said each of said one or more main cell division units through a first selection switch, and electrically connected to a second bit line assigned to the reference cell division unit through a second selection switch;

a second global bit line electrically connected to the corresponding one of said sense amplifiers, electrically connected to a third bit line assigned to said each of said one or more main cell division units through a third selection switch, and electrically connected to a fourth bit line assigned to the reference cell division unit through a fourth selection switch; and a switching circuit that switches off the second selection switch, switches off the third selection switch, and switches on the fourth selection switch when the first selection switch is turned on, whereas said switching circuit switches off the first selection switch, switches on the second selection switch, and switches off the fourth selection switch when the third selection switch is turned on.

* * * * *